United States Patent
Maeda

[11] Patent Number: 5,917,198
[45] Date of Patent: Jun. 29, 1999

[54] GATE ELECTRODES AND MATRIX LINES MADE OF W/TA ALLOY FOR LCD APPARATUS

[75] Inventor: Akitoshi Maeda, Tokyo, Japan

[73] Assignee: NEC Corporation, Tokyo, Japan

[21] Appl. No.: 08/825,050

[22] Filed: Mar. 27, 1997

[30] Foreign Application Priority Data

Mar. 29, 1996 [JP] Japan .................................. 8-076084

[51] Int. Cl.⁶ .................................................. H01L 21/44
[52] U.S. Cl. .......................... 257/59; 257/59; 257/72; 257/53; 257/771; 257/763; 257/764
[58] Field of Search ........................... 438/523, 582, 438/648, 658, 683, 785; 257/59, 53, 72, 752, 758, 759, 763, 764, 774

[56] References Cited

U.S. PATENT DOCUMENTS

| | | | |
|---|---|---|---|
| 3,875,444 | 4/1975 | Magendans et al. | 378/144 |
| 3,922,168 | 11/1975 | Restall et al. | 148/32 |
| 4,140,555 | 2/1979 | Garcia et al. | 148/32 |
| 5,336,638 | 8/1994 | Suzuki et al. | 438/240 |
| 5,431,773 | 7/1995 | Ikeda et al. | 438/722 |
| 5,675,185 | 10/1997 | Chen et al. | 257/774 |
| 5,736,750 | 4/1998 | Yamazaki et al. | 257/346 |

FOREIGN PATENT DOCUMENTS

| | | |
|---|---|---|
| A1275753 | 11/1989 | Japan . |
| 334368 | 2/1991 | Japan . |
| A 3-34368 | 2/1991 | Japan . |
| A5100248 | 4/1993 | Japan . |
| 07225395 | 8/1995 | Japan . |
| 08070125 | 3/1996 | Japan . |

OTHER PUBLICATIONS

M. Ikeda, "TFT–LCD Gate and Data Bus–Line Design and Process Technologies," SID 95 Digest, pp. 11–14.

*Primary Examiner*—Fetsum Abraham
*Attorney, Agent, or Firm*—Sughrue, Mion, Zinn, Macpeak & Seas, PLLC

[57] ABSTRACT

A conductive material comprises a tungsten and tantalum alloy including approximately 1 to 5 atm percent of tantalum.

11 Claims, 9 Drawing Sheets

GATE ELECTRODES AND MATRIX LINES MADE OF W/TA ALLOY FOR LCD APPARATUS

BACKGROUND OF THE INVENTION

1. Field of the Invention

The present invention relates to a conductive material for wiring lines and electrodes of an active matrix-type liquid crystal display (LCD) apparatus and a gate electrode of a metal oxide semiconductor (MOS) device.

2. Description of the Related Art

Active matrix-type LCD apparatuses are so thin and light that they are often used in various display apparatuses. Also, since the active matrix-type LCD apparatuses can be of a large size and fine screen with a high quality and a low power dissipation, cathode ray tubes (CRTs) have been replaced with the active matrix-type LCD apparatuses.

In an active matrix-type LCD apparatus, one thin film transistor (TFT) is provided as a switching element for each pixel. The TFT is constructed by a gate electrode, a semiconductor active layer made of amorphous silicon opposing the gate electrode, a drain electrode, and a source electrode connected to a transparent pixel electrode.

In the active matrix-type LCD apparatus, in order to effectively increase the area of the screen and make the screen fine, gate bus lines (scan bus lines) and drain bus lines (signal bus lines) connected to TFTs need to be narrower and longer.

For example, in an inverted staggered TFT where the gate electrode is located beneath the semiconductor active layer, the scan bus line connected to the gate electrode of the TFT and the gate electrode need to be thin and low in resistivity. In addition, the scan bus line and the gate electrode need to be chemical-resistant in processes such as photolithography processes and rinsing processes.

Also, in a staggered TFT where the gate electrode is located above the semiconductor active layer, the signal line connected to the drain electrode of the TFT and the gate electrode need to be easily formed and low in resistivity. In addition, the signal bus line and the drain electrode need to be chemical-resistant in chemical processes such as photolithography processes and rinsing processes.

A first prior art conductive material for the scan line, the signal line, the gate electrode and the drain electrode is made of metal such as tantalum (Ta), titanium (Ti), chrome (Cr) or molybdenum-tantalum alloy (Mo—Ta).

The first prior art conductive material is, however, high in resistivity, not easy to be formed, and of low chemical-resistance of in chemical processes.

A second prior art conductive material for the above mentioned lines and electrodes is made of aluminum (Al) which is very low in resistivity, for example, 3 $\mu\Omega$·cm.

The second prior art conductive material is, however, subject to hillocks and voids, thus creating short-circuits and disconnections in the conductive material. Also, aluminum is melted into chemicals during chemical processes, so that the chemicals are contaminated by the melted aluminum.

In order to suppress the generation of hillocks and voids, a third prior art conductive material for the above-mentioned lines and electrodes is made of aluminum alloy including about 0.1 to 10 atm percent of at least one of Ta, Ti and zirconium (Zr) (see JP-A-5-100248). This conductive material is heated at 250 to 500° C. Also, this conductive material is coated by Ta which is chemical-resistant in chemical processes, or is anodized, thus suppressing the generation of hillocks and voids. In this case, the resistivity is about 10 $\mu\Omega$·cm.

However, the third conductive material has complex manufacturing steps such as a Ta coating step or an anodizing step, thus increasing the manufacturing cost. Also, aluminum is melted into chemicals during chemical processes, so that the chemicals are contaminated by the melted aluminum.

A fourth prior art conductive material for the above-mentioned lines and electrodes is made of Mo or tungsten (W). This conductive material is relatively low in resistivity, for example, 15 $\mu\Omega$·cm. Also, this conductive material can be formed by using both a wet etching process and a dry etching process in the same way as with aluminum.

In the fourth prior art conductive material, however, Mo and W are not chemical-resistant in chemical processes. Also, W has a bad substrate contact characteristic.

A fifth prior art conductive material for the above-mentioned lines and electrodes is made of Mo—W alloy (see M. Ikeda, "TFT-LCD Gate and Data Bus-Line Design and Process Technologies", SID 95 Digest, pp.11–14, 1995). This conductive material is also relatively low in resistivity, for example, 15 $\mu\Omega$·cm. Also, this conductive material can be easily formed by adjusting the composition of Mo and W.

The fifth prior art conductive material is, however, still low in chemical-resistance.

A sixth prior art conductive material for the above-mentioned lines and electrodes is made of Ta alloy which includes 30 to 80 atm percent of Ta (see JP-A-3-34368). The Ta alloy is a composite metal of Ta and W, Ta and nickel (Ni), Ta and cobalt (Co), Ta and rhodium (Rh), or Ta and iridium (Ir). Particularly, when the atm percent of Ta is 50 to 70, the resistivity is low, i.e., 30 to 60 $\mu\Omega$·cm. Also, this conductive material can be formed by an RF sputtering process using a W (or Ni, Co, Rh, Ir) target and a Ta target whose sputtered areas are adjusted.

The sixth prior art conductive material is, however, still high in resistivity, as compared with $\alpha$-Ta (25 to 30 $\mu\Omega$·cm) or Cr (25 $\mu\Omega$·cm). Thus, the sixth conductive material is not suitable for large size fine LCD apparatuses.

A seventh prior art conductive material for the above-mentioned lines and electrodes is made of W/Ta alloy which includes 30 to 95 atm percent of Ta (see JP-A-1-275753). Particularly, when the atm percent of Ta is 50 to 60, the resistivity is low, i.e., 35 to 50 $\mu\Omega$·cm. Also, this conductive material can be easily formed by a dry etching process. Further, this conductive material is resistant to acids such as sulfating water. In addition, an anodized oxide layer can be easily formed on this conductive material.

The seventh prior art conductive material is, however, still high in resistivity, as compared with $\alpha$-Ta (25 to 30 $\mu\Omega$·cm) or Cr (25 $\mu\Omega$·cm). Thus, the seventh conductive material is not suitable for large size fine LCD apparatuses.

Also, in the sixth and seventh prior art materials, since the etching selectivity by a wet etching process using fluorine acid or fluoric nitric acid is inferior, a dry etching process has to be adopted, thus increasing the manufacturing cost.

SUMMARY OF THE INVENTION

It is an object of the present invention to provide a conductive material having a sufficiently low resistivity for an LCD apparatus capable of adopting a wet etching process.

Another object is to provide a conductive material having a sufficiently low resistivity for a MOS device capable of adopting a wet etching process.

According to the present invention, a conductive material is made of W/Ta alloy including approximately 1 to 5 atm percentage of Ta.

This W/Ta alloy is sufficiently low in resistivity for LCD apparatuses and a MOS device. Also, this W/Ta alloy can be etched by a wet etching process using $H_2O_2$ water with a high etching rate.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENTS

Figure 1:
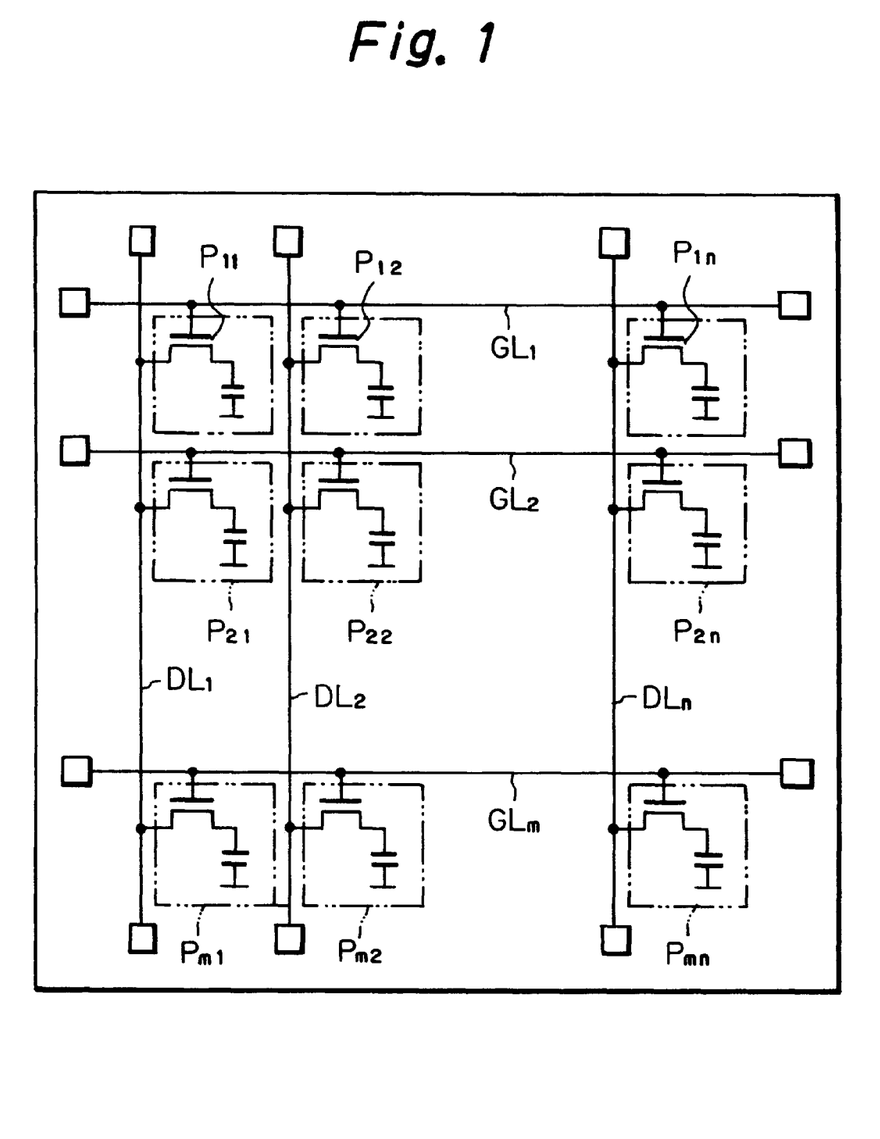
FIG. 1 is a plan view illustrating an LCD apparatus to which an embodiment of the conductive material according to the present invention is applied.

In FIG. 1, which illustrates an active matrix-type LCD apparatus to which an embodiment of the present invention is applied, references $GL_1, GL_2, \ldots, GL_m$ designate scan bus lines, and $DL_1, DL_2, DL_m$ designate signal bus lines. A plurality of pixels $P_{11}, P_{12}, \ldots, P_{mn}$ are provided at intersections between the scan bus lines $GL_1, GL_2, \ldots, GL_m$ and the signal lines $DL_1, DL_2, \ldots, DL_n$.

Figure 2:
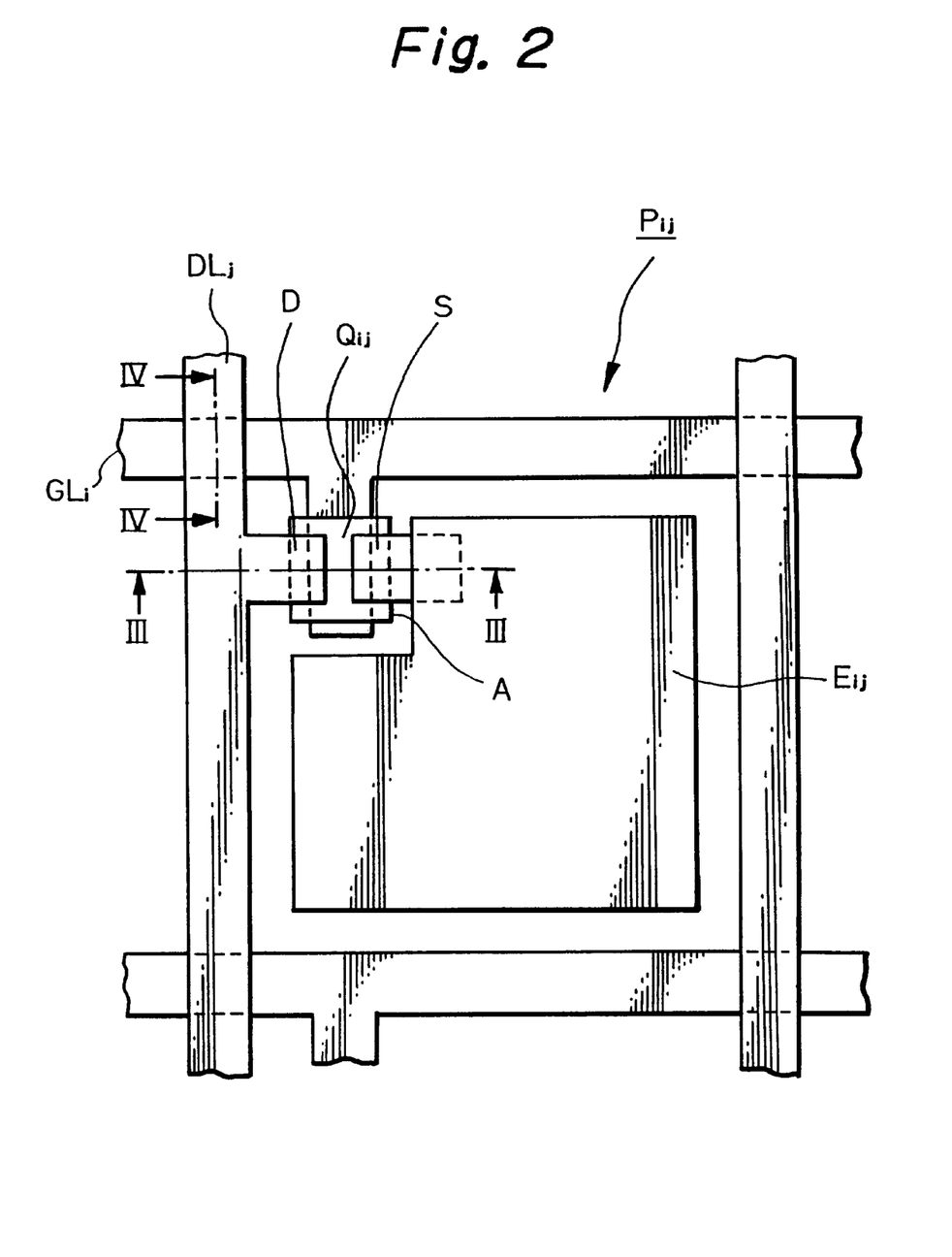
FIG. 2 is a partial plan view of the apparatus of FIG. 1.

In FIG. 2, which is an enlargement of one pixel $P_{ij}$ of FIG. 1, the pixel $P_{ij}$ is constructed by a thin film transistor (TFT) $Q_{ij}$ and a transparent pixel electrode $E_{ij}$. The TFT $Q_{ij}$ is formed by a gate electrode G shunted from the scan bus line $GL_i$, a semiconductor active layer A made of amorphous silicon opposing the gate electrode G, a drain electrode D shunted from the signal bus line $DL_j$, and a source electrode S connected to the transparent pixel electrode $E_{ij}$. One end of the semiconductor active layer A is connected to the drain electrode D, and the other end of the semiconductor active layer A is connected to the source electrode S.

Figure 3:
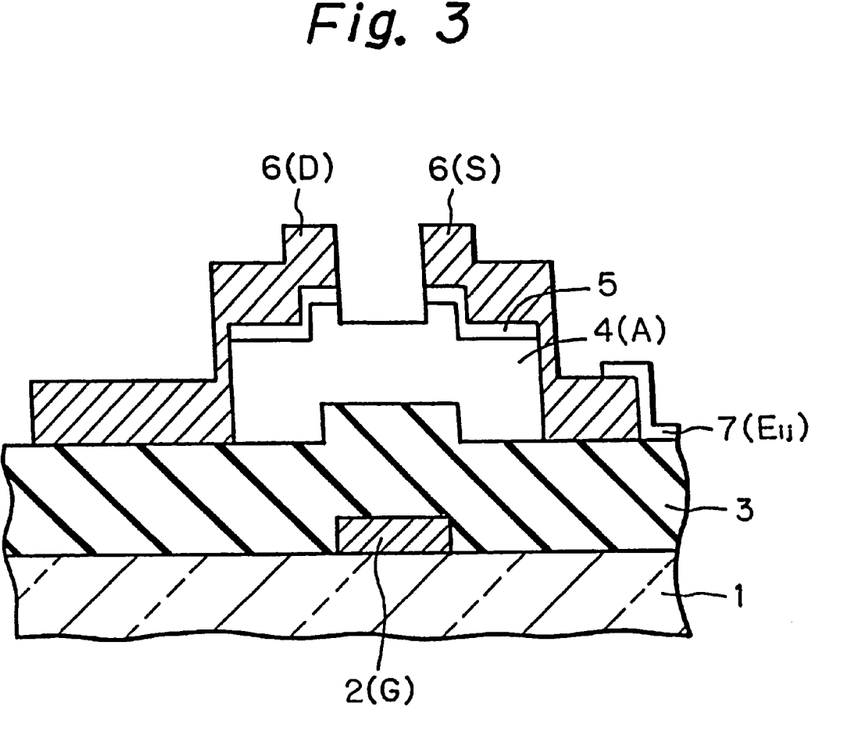
FIGS. 3 and 4 are cross-sectional views taken along the lines III—III and IV—IV, respectively, of FIG. 2.
Figure 4:
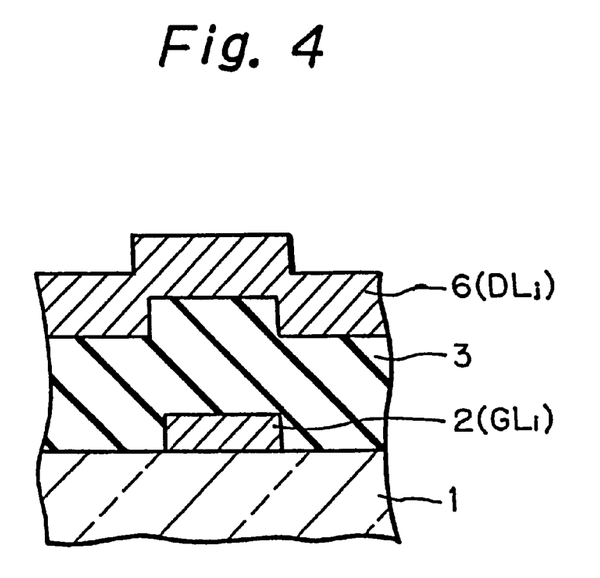

In more detail, referring to FIGS. 3 and 4 which are cross-sectional views taken along the lines III—III and IV—IV, respectively, of FIG. 2, the TFT $Q_{ij}$ is of an inverted staggered type where the gate electrode G is beneath the semiconductor active layer A, and also, the TFT $Q_{ij}$ is of a channel etching type. That is, a conductive layer 2 is deposited on a glass substrate 1. The conductive layer 2 is patterned, so that the gate electrode G and the scan bus line $GL_i$ are formed. Also, a gate insulating layer 3 made of silicon nitride is deposited on the entire surface. Further, a non-doped amorphous silicon layer 4 is deposited, and N-type impurities are implanted into the amorphous silicon layer 4 to form an $N^+$-type impurity region 5 thereon. Further, a conductive layer 6 is deposited on the entire surface. The conductive layer 6 is patterned, so that the signal line $DL_j$, the drain electrode D and the source electrode S are formed. Also, the amorphous silicon layer 4 associated with the $N^+$-type impurity region 5 are etched by using the patterned conductive layer 6 as a mask, so that the semiconductor active layer A of an island shape is formed and opposes the gate electrode G. In this case, note that a channel portion of the semiconductor active layer A is partly etched.

Further, an indium tin oxide (ITO) layer 7 is deposited by a sputtering process, and is patterned to form the transparent pixel electrode $E_{ij}$.

The conductive layers 2 and 6 are made of W—Ta alloy including approximately 1 to 5 atm percentage of Ta. These conductive layers 2 and 6 can be easily manufactured by a DC magnetron sputtering process using a target having the same composition, i.e., a target made of W—Ta alloy including approximately 1 to 5 atm percentage of Ta. Since the mass number (=184) of W is almost the same as that (=181) of Ta, the scattering effect by discharging gas (argon) ions to W is almost the same as the scattering effect by discharging gas (argon) ions to Ta, so that the composition of the conductive layers 2 and 6 becomes almost the same as that of the target. The DC magnetron sputtering conditions are as follows;

vacuum: less than approximately $5 \times 10^{-4}$ Pa;

gas pressure: approximately 0.5 to 1.0 Pa;

power density: approximately 3.0 to 4.5 W/cm$^2$; and substrate temperature: approximately 200° C.

The characteristics of the conductive layers 2 and 6 are explained with reference to FIGS. 5, 6, 7A, 7B and 8.

Figure 5:
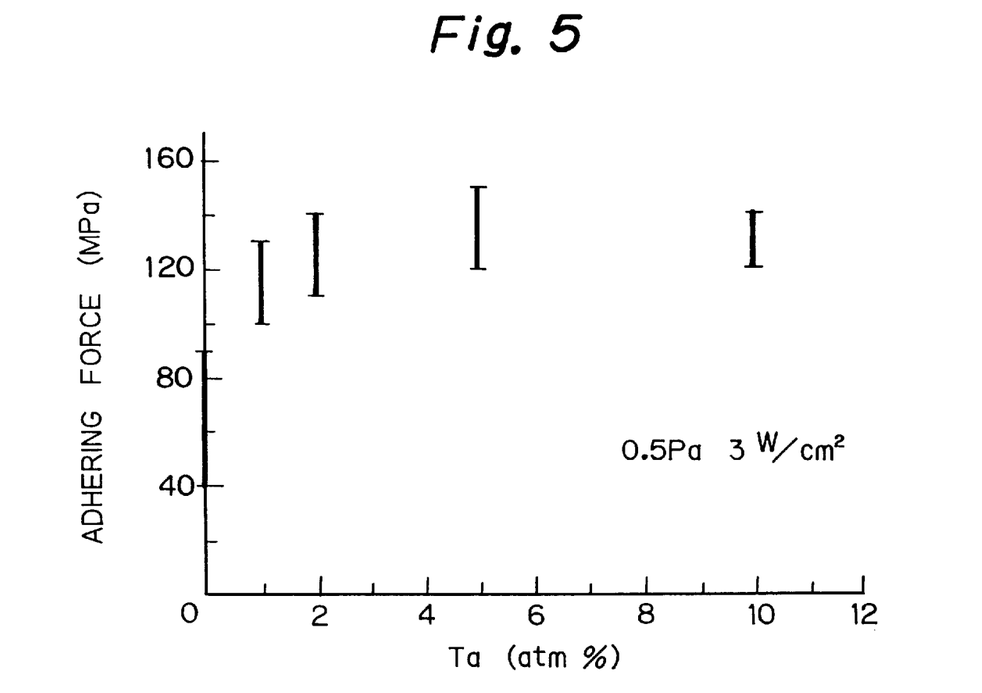
FIG. 5 is a graph showing an adhering force of the conductive material according to the present invention.

In FIG. 5, which shows an adhering force of the conductive layers 2 and 6 to the glass substrate 1 and the gate insulating layer 3, the Ta component of the conductive layers 2 and 6 serves as a binder. That is, if the atm percentage of Ta is 0, i.e., the conductive layers 2 and 6 are made of pure W, the adhering force of the conductive layers 2 and 6 is so small that the conductive layers 2 and 6 may be separated from the glass substrate 1 and the gate insulating layer 3, respectively. On the other hand, if the atm percentage of Ta is larger than approximately 1, the adhering force of the conductive layers 2 and 6 to the glass substrate 1 and the gate insulating layer 3, respectively, is remarkably increased. The separation of the conductive layers 2 and 6 was not observed under the condition that the gas pressure of the DC magnetron sputtering process is within approximately 0, 5 to −1.2 Pa.

Thus, if the atm percentage of Ta in the W—Ta conductive layers 2 and 6 is larger than approximately 1, the adhering force of the conductive layers 2 and 6 can be improved.

Figure 6:
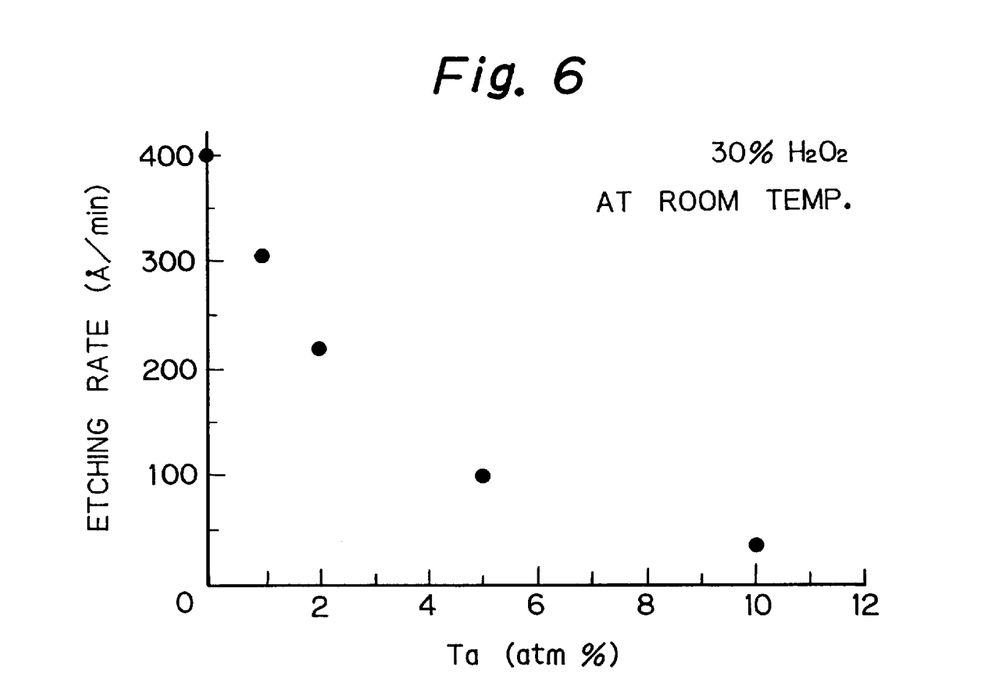
FIG. 6 is a graph showing an etching rate of the conductive material according to the present invention.

The etching of the conductive layers 2 and 6 can be carried out by a wet etching process using hydrogen peroxide ($H_2O_2$) water. In this case, the etching selectivity of the conductive layer 2 to the glass substrate 1 and the etching selectivity of the conductive layer 6 to the gate insulating layer 3, the amorphous silicon layer 4 and the $N^+$-type impurity region 5 are excellent. That is, as shown in FIG. 6, which shows an etching rate of the conductive layers 2 and 6 by a wet etching process using 30 percent $H_2O_2$ water at room temperature, the larger the composition of Ta, the smaller the etching rate. For example, the etching rate is about 400 Å/min, about 100 Å/min and about 40 Å/min, at 0 atm percent, 5 atm percent and 10 atm percent, respectively, of Ta. Therefore, if the conductive layers 2 and 6 are 1200 Å thick, about 3 minutes, about 12 minutes and about 30 minutes of etching time are required at 0 atm percent, 5 atm percent and 10 atm percent, respectively, of Ta. Note that the temperature of the $H_2O_2$ water is increased to increase the etching rate; however, this invites a rapid deterioration of the $H_2O_2$ water.

Thus, if the atm percentage of Ta in the conductive layers 2 and 6 is smaller than approximately 5, the etching selectivity can be improved.

Note that, if a residual amount of the conductive layers 2 and 6 left by the above-mentioned wet etching process exists, such a residual can be removed by an additional dry etching process using a mixture gas of $CF_4$ and $O_2$.

As in the sixth and seventh prior arts, if the conductive layers 2 and 6 includes more than approximately 6 atm percentage of Ta, the etching of the conductive layers 2 and 6 may be carried out by a dry etching using fluorine gas such as $CF_4$ gas or $SF_6$ gas. In this case, however, the etching selectivity of the conductive layer 6 to the $N^+$-type impurity region 5 is low, so that it is impossible to control the etching of the channel portion of the amorphous silicon layer 4.

Figure 7A:
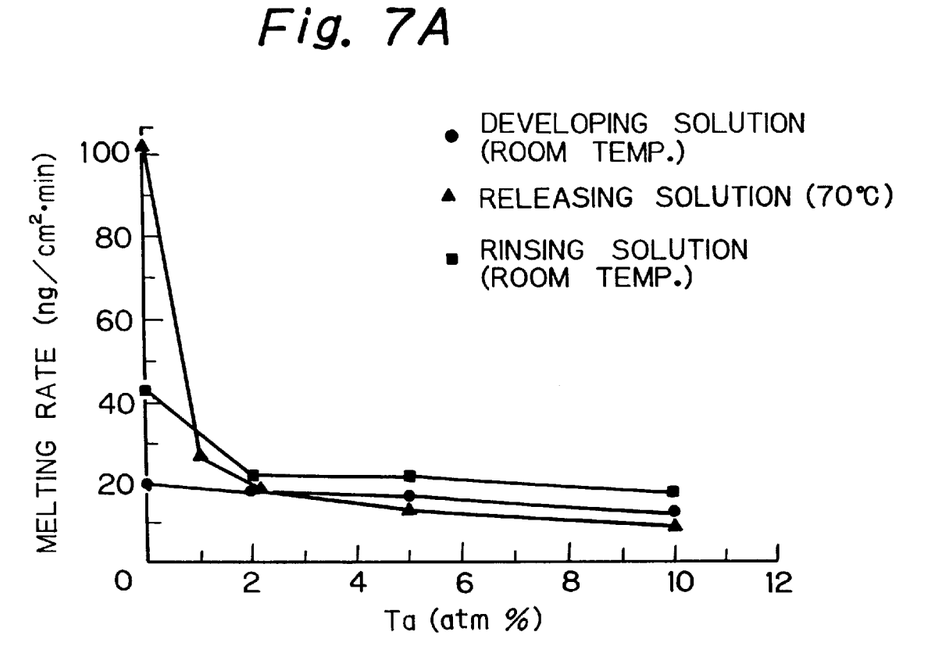
FIG. 7A is a graph showing a melting rate of the conductive material according to the present invention.

FIG. 7A shows a melting rate of the conductive layers 2 and 6 into chemicals such as developing solution at room temperature, releasing solution at 30° C. and rinsing solution at room temperature. The melting rate of the conductive layers 2 and 6 into the developing solution is a little smaller at 1 atm percent or more of Ta than at 0 atm percent of Ta. On the other hand, the melting rate of the conductive layers 2 and 6 into the releasing solution and the rinsing solution are remarkably smaller at 1 atm percent or more of Ta than at 0 atm percent of Ta.

Thus, if the atm percentage of Ta in the W—Ta conductive layers 2 and 6 is larger than approximately 1, the melting rate of the conductive layers 2 and 6 into chemicals can be improved, so that the chemicals are hardly contaminated.

Figure 7B:
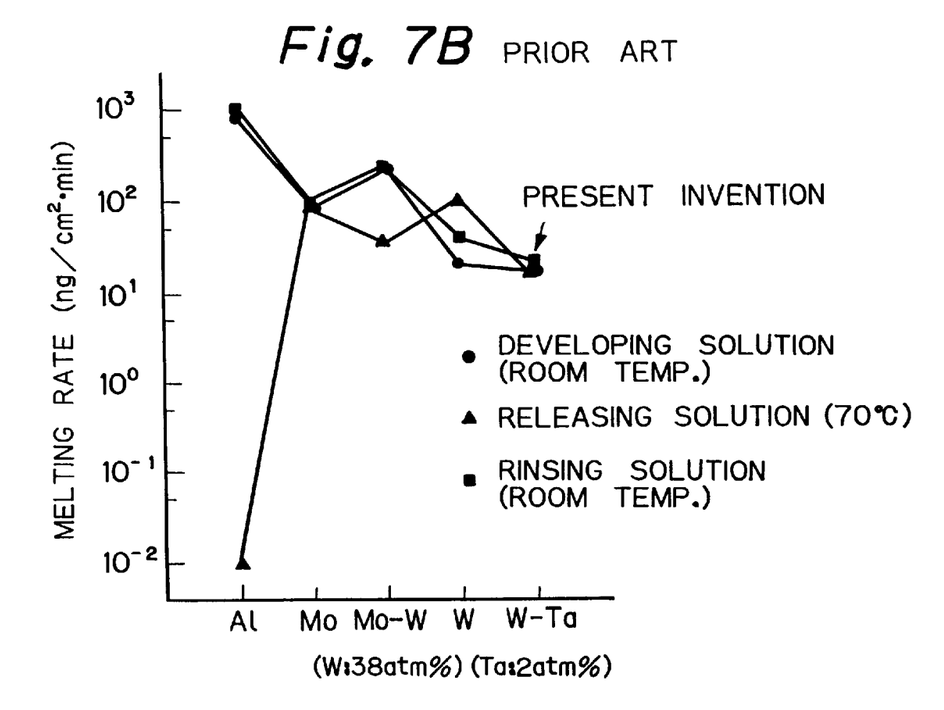
FIG. 7B is a graph showing a melting rate of the conductive material in the prior art.

Note that the melting rate of the prior art conductive materials such as Al, Mo, Mo—W (72 atm % of W) and W as shown in FIG. 7B is larger than the melting rate of the present invention such as W—Ta (2 atm % of Ta). Also, although the melting rate of Al into releasing solution is very small, this melting rate is actually increased due to the humidity of the releasing solution or the like.

Figure 8:
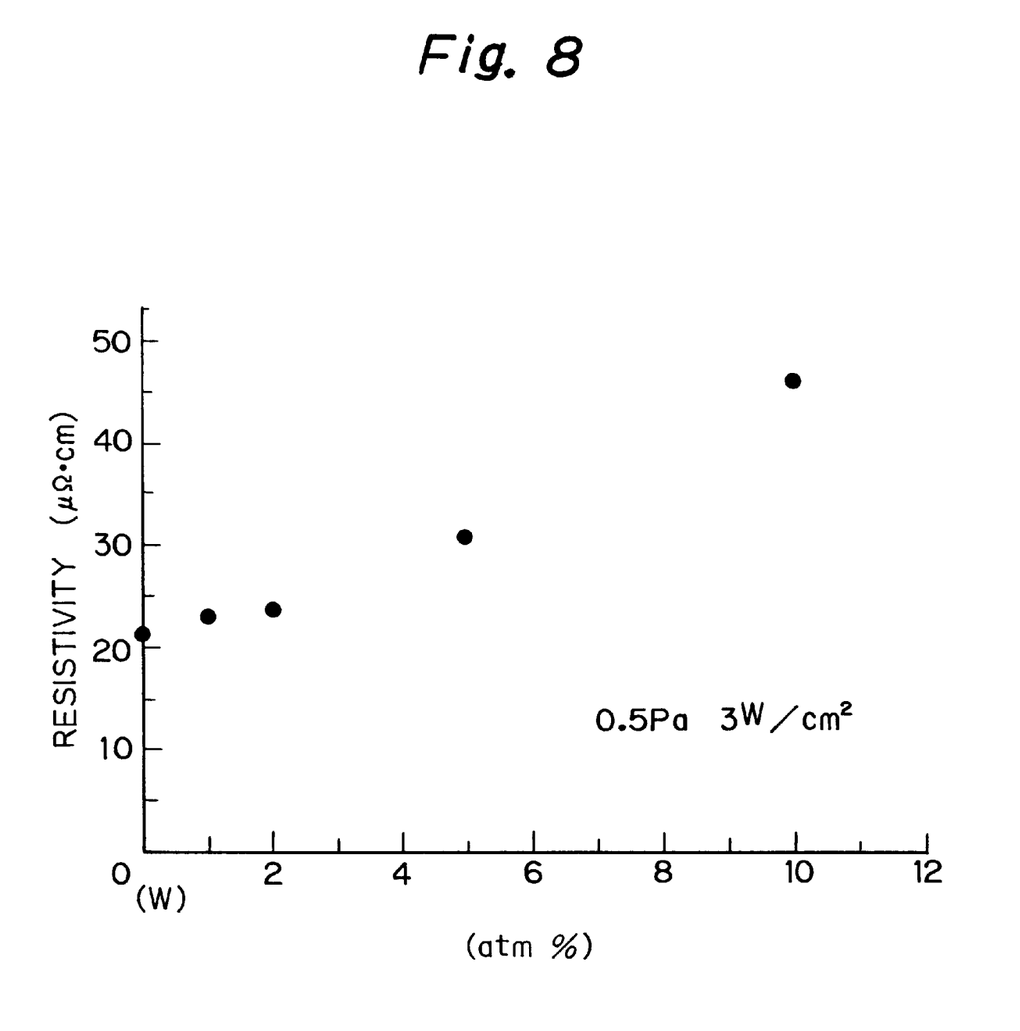
FIG. 8 is a graph showing a resistivity of the conductive material according to the present invention.

In FIG. 8, which shows a resistivity of the conductive layers 2 and 6, the larger the composition of Ta, the larger the resistivity. However, when the composition of Ta is within approximately 1 to 5 atm percent, the resistivity is 20 to 30 $\mu\Omega\cdot cm$ which is just a little larger than that (=15 $\mu\Omega\cdot cm$) of W or Mo.

Thus, if the atm percentage of Ta in the conductive layers 2 and 6 is within approximately 1 to 5, the resistivity can be reduced.

Figure 9:
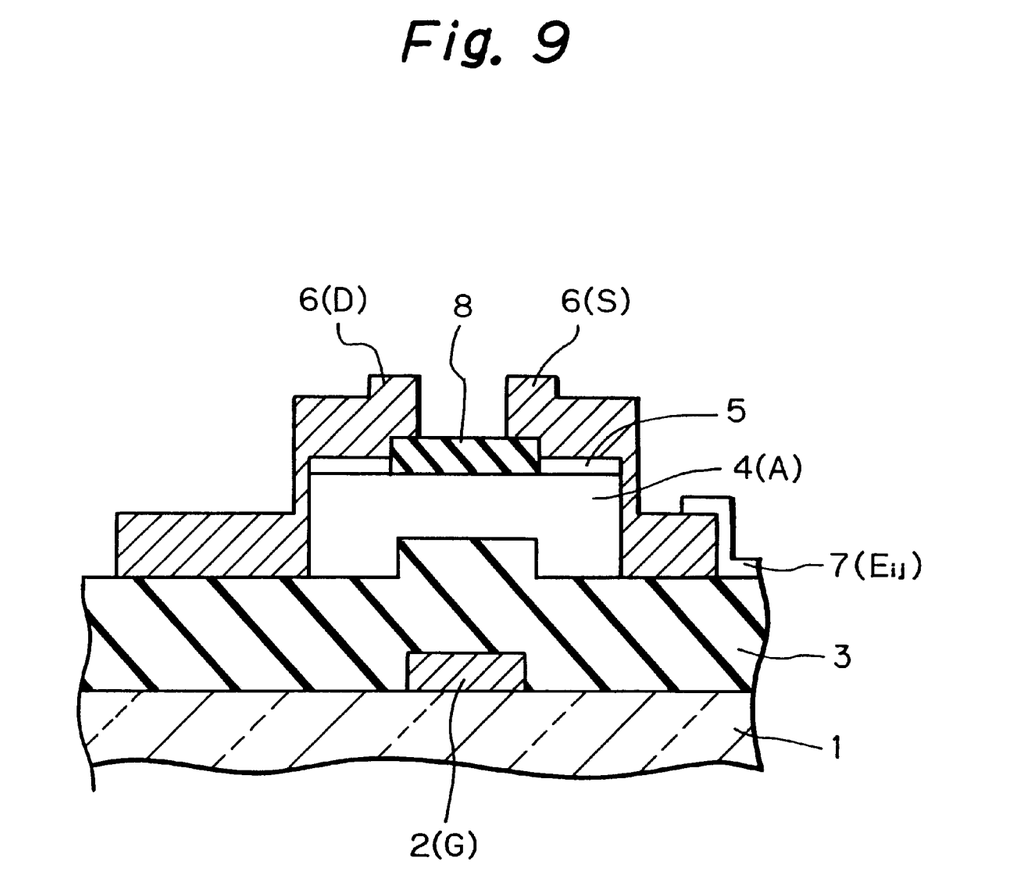
FIGS. 9 and 10 are cross-sectional views illustrating modifications of FIG. 3.

The above-mentioned embodiment can also be applied to a channel protection type of an inverted staggered TFT as illustrated in FIG. 9. In FIG. 9, an etching stopper 8 made of silicon nitride is provided on the amorphous silicon layer 4. That is, when the conductive layer 6 is etched by a wet etching process, the amorphous silicon layer 4 is hardly etched. In FIG. 9, the conductive layers 2 and 6 are made of W—Ta alloy including approximately 1 to 5 atm percent of Ta.

In FIGS. 3, 4 and 9, after the signal bus line $DL_j$, the drain electrode D and the source electrode S are formed, a final heating process can be carried out at about 250° C. at the highest.

Figure 10:
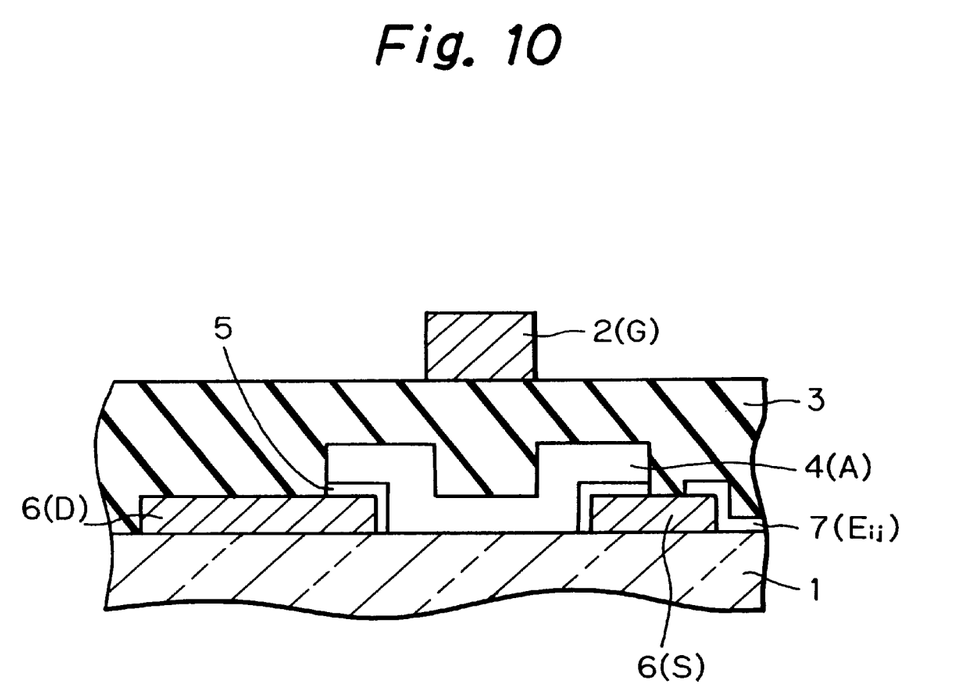

The above-mentioned embodiment can further be applied to a staggered TFT as illustrated in FIG. 10. In FIG. 10, the gate electrode 2(G) is located above the amorphous silicon layer 4 (the semiconductor active layer A). Also, the conductive layers 2 and 6 are made of W—Ta alloy including approximately 1 to 5 atm percent of Ta. Note that the $N^+$-impurity region 5 is formed by doping impurities into the source electrode S and the drain electrode D in advance and diffusing the impurities into the semiconductor active layer 4.

Also, in FIG. 10, after the scan bus line $GL_i$ and the gate electrode G are formed, a final heating process can be carried out at about 250° C. at the highest.

On the other hand, generally, in a MOS device, a gate electrode is conventionally made of impurity doped polycrystalline silicon, whose resistivity is very large, i.e., about 1000 $\mu\Omega\cdot cm$. In order to reduce the resistivity, a polycide structure and a refractory metal layer have been adopted for the gate electrode. Note that the polycide structure is a double structure formed by polycrystalline silicon and refractory metal silicide such as tungsten silicide ($WSi_x$), molybdenum silicide ($MoSi_x$) or titanium silicide ($TiSi_x$). However, the polycide structure and the refractory metal layer such as Ti or Mo are still high in resistivity.

Figure 11:
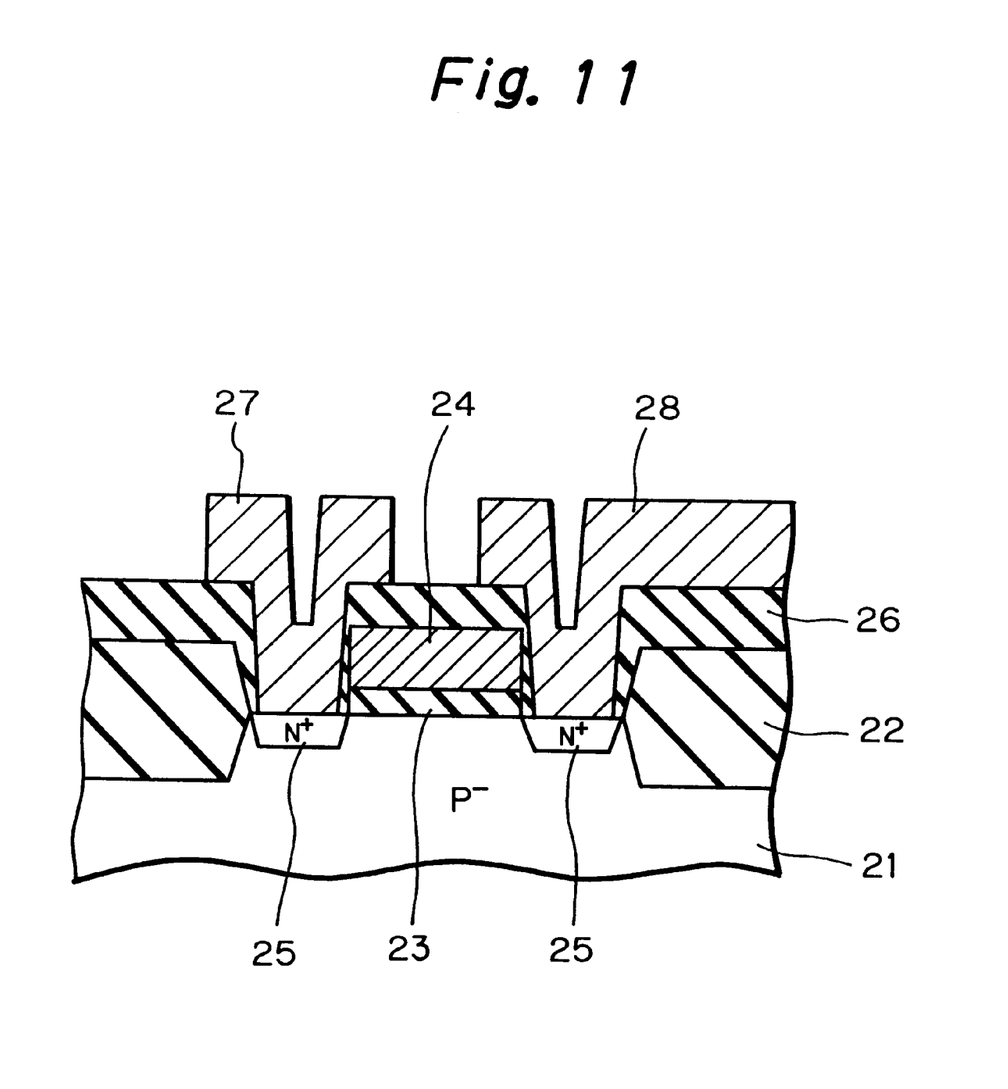
FIG. 11 is a cross-sectional view illustrating a MOS device to which the embodiment of the conductive material according to the present invention is applied.

The above-mentioned embodiment can also be applied to such a MOS device as illustrated in FIG. 11.

In FIG. 11, reference numeral 21 designates a $P^-$-type monocrystalline silicon substrate on which a field silicon oxide layer 22 and a gate silicon oxide layer 23 are formed. Also, a gate electrode 24 is formed on the gate silicon oxide layer 23. Further, $N^+$-type impurity regions 25 are formed within the substrate 21 on both sides of the gate electrode 24. A phospho-silicated glass (PSG) layer 26 is formed and contact holes are perforated therein. Also, a source electrode 27 and a drain electrode 28 are formed and are connected via the contact holes of the PSG layer 26 to the $N^+$-type impurity regions 25.

In FIG. 11, the gate electrode 24 is made of W—Ta alloy including approximately 1 to 5 atm percent of Ta.

The PSG layer 26 prevents impurity ions from penetrating the gate electrode 24 when the impurity ions are introduced into the substrate 21 to form the $N^+$-type impurity regions 25. Note that since the gate electrode 24 made of W—Ta alloy is constructed by a cylindrical crystal structure, impurity ions can easily penetrate the gate electrode 24. Also, when forming the gate electrode 24, the gate silicon oxide layer 23 may be damaged. In order to remedy the damaged gate silicon oxide layer 23, a heating operation at about 1000° C. is carried out in a mixture atmosphere of water and hydrogen. In this case, the W—Ta alloy of the gate electrode 24 is hardly oxidized, and only the damaged gate silicon oxide layer 23 is oxidized.

As explained hereinabove, according to the present invention, the resistivity of the W—Ta alloy including approximately 1 to 5 atm percent of Ta is sufficiently low for an LCD apparatus and a MOS device. In addition, this W—Ta alloy can be easily etched by $H_2O_2$ water, and therefore, the selectivity of the W—Ta alloy to other underlying layers can be improved. This can enable adopting a wet etching process to decrease the manufacturing cost.

I claim:

1. An active matrix-type liquid crystal display apparatus comprising:
   a transparent insulating substrate;
   a plurality of scan bus lines in parallel to each other formed on said transparent insulating substrate, said scan bus lines being made of tungsten-tantalum alloy including approximately 1 to 5 atm percent of tantalum;

a plurality of gate electrodes formed on said transparent insulating substrate and connected to one of said scan bus lines, said gate electrodes being made of tungsten-tantalum alloy including approximately 1 to 5 atm percent of tantalum;

a gate insulating layer formed on said scan bus lines and said gate electrodes;

a plurality of semiconductor active layers formed on said gate insulating layer;

a plurality of signal bus lines in parallel to each other formed on said gate insulating layer, said signal bus lines being perpendicular to said scan bus lines and being made of tungsten-tantalum alloy including approximately 1 to 5 atm percent of tantalum;

a plurality of drain electrodes formed on said gate insulating layer and said semiconductor active layer, each of said drain electrodes being connected to one of said signal bus lines, said drain electrodes being made of tungsten-tantalum alloy including approximately 1 to 5 atm percent of tantalum;

a plurality of source electrodes formed on said gate insulating layer and said semiconductor active layer, said source electrodes being made of tungsten-tantalum alloy including approximately 1 to 5 atm percent of tantalum; and a plurality of transparent pixel electrodes formed on said gate insulating layer and said source electrodes, each of said transparent pixel electrodes being connected to one of said source electrodes.

2. The apparatus as set forth in claim 1, wherein said tungsten-tantalum alloy is formed by a DC magnetron sputtering process using a tungsten-tantalum alloy target.

3. The apparatus as set forth in claim 2, wherein said DC magnetron sputtering process is carried out at a gas pressure of approximately 0.5 to 1.0 Pa.

4. An active matrix-type liquid crystal display apparatus comprising:

a transparent insulating substrate;

a plurality of signal bus lines in parallel to each other formed on said transparent insulating substrate, said signal bus lines being made of tungsten-tantalum alloy including approximately 1 to 5 atm percent of tantalum;

a plurality of drain electrodes formed on said transparent insulating substrate, each of said drain electrodes being connected to one of said signal bus lines, said drain electrodes being made of tungsten-tantalum alloy including approximately 1 to 5 atm percent of tantalum;

a plurality of source electrodes formed on said transparent insulating substrate said source electrodes being made of tungsten-tantalum alloy including approximately 1 to 5 atm percent of tantalum;

a plurality of semiconductor active layers formed on said transparent insulating substrate, said drain electrodes and said source electrodes, each of said semiconductor active layers being connected between one of said drain electrodes and one of said source electrodes;

a plurality of transparent pixel electrodes formed on said transparent insulting substrate and said source electrodes, each of said transparent pixel electrodes being connected to one of said source electrodes;

a gate insulating layer formed on said signal bus lines, said drain electrodes, and source electrodes;

a plurality of scan bus lines in parallel to each other formed on said gate insulating layer, said scan bus lines being perpendicular to said signal bus lines and being made of tungsten-tantalum alloy including approximately 1 to 5 atm percent of tantalum; and a plurality of gate electrodes formed on said gate insulating layer and connected to one of said scan bus lines, said gate electrodes being made of tungsten-tantalum alloy including approximately 1 to 5 atm percent of tantalum.

5. The apparatus as set forth in claim 4, wherein said tungsten-tantalum alloy is formed by a DC magnetron sputtering process using a tungsten-tantalum alloy target.

6. The apparatus as set forth in claim 5, wherein said DC magnetron sputtering process is carried out at a gas pressure of approximately 0.5 to 1.0 Pa.

7. A MOS device comprising:

a semiconductor substrate;

a gate insulating layer formed on said semiconductor substrate;

a gate electrode formed on said gate insulating layer, said gate electrode being made of tungsten-tantalum alloy including approximately 1 to 5 atm percent of tantalum;

impurity regions within said semiconductor substrate;

an impurity doped insulating layer formed on said gate electrode and said impurity regions, contact holes being provided in said impurity doped insulating layer and reaching said impurity regions; and source and drain electrodes formed on said impurity doped insulating layer and connected via said contact holes to said impurity regions.

8. The device as set forth in claim 7, wherein said tungsten-tantalum alloy is formed by a DC magnetron sputtering process using a tungsten-tantalum alloy target.

9. The device as set forth in claim 8, wherein said DC magnetron sputtering process is carried out at a gas pressure of approximately 0.5 to 1.0 Pa.

10. An active matrix-type liquid crystal display apparatus comprising:

a transparent insulating substrate;

a plurality of scan bus lines in parallel to each other formed on said transparent insulating substrate;

a plurality of gate electrodes formed on said transparent insulating substrate and connected to one of said scan bus lines;

a gate insulating layer formed on said scan bus lines and said gate electrodes;

a plurality of semiconductor active layers formed on said gate insulating layer;

a plurality of signal bus lines in parallel to each other formed on said gate insulating layer, said signal bus lines being perpendicular to said scan bus lines;

a plurality of drain electrodes formed on said gate insulating layer and said semiconductive active layer, each of said drain electrodes being connected to one of said signal bus lines;

a plurality of source electrodes formed on said gate insulating layer and said semiconductive active layer, said source electrodes; and a plurality of transparent pixel electrodes, each of said transparent pixel electrodes being connected to one of said source electrodes, at least one of said scan bus lines, said gate electrodes, said signal bus lines, said drain electrodes and said source electrodes being made of tungsten tantalum alloy including approximately 1 to 5 atm percent of tantalum.

11. An active matrix-type liquid crystal display apparatus comprising:

a transparent insulating substrate;

a plurality of signal bus lines in parallel to each other formed on said transparent insulating substrate;

a plurality of drain electrodes formed on said transparent insulating substrate, each of said drain electrodes being connected to one of said signal bus signal bus lines;

a plurality of source electrodes formed on said transparent insulating substrate said source electrodes;

a plurality of semiconductor active layers formed on said transparent insulating substrate, said drain electrodes and said source electrodes, each of said semiconductor active layers being connected between one of said drain electrodes and one of said source electrodes;

a gate insulating layer formed on said signal bus lines, said drain electrodes, and source electrodes;

a plurality of scan bus lines in parallel to each other formed on said gate insulating layer, said scan bus lines being perpendicular to said signal bus lines; and a plurality of gate electrodes formed on said gate insulating layer and connected to one of said scan bus lines, at least one of said signal bus lines, said drain electrodes, said source electrodes, said scan bus lines and said gate electrodes being made of tungsten-tantalum alloy including approximately 1 to 5 atm percent of tantalum.

* * * * *